(12) United States Patent
Narishige et al.

(10) Patent No.: US 8,071,473 B2
(45) Date of Patent: Dec. 6, 2011

(54) SEMICONDUCTOR DEVICE MANUFACTURING METHOD AND STORAGE MEDIUM

(75) Inventors: Kazuki Narishige, Nirasaki (JP); Koichi Nagakura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 717 days.

(21) Appl. No.: 12/222,666

(22) Filed: Aug. 13, 2008

(65) Prior Publication Data
US 2009/0045165 A1  Feb. 19, 2009

Related U.S. Application Data

(60) Provisional application No. 60/996,022, filed on Oct. 25, 2007.

(30) Foreign Application Priority Data

Aug. 17, 2007  (JP) .................................. 2007-213021

(51) Int. Cl.
*H01L 21/4763* (2006.01)
(52) U.S. Cl. ........ 438/620; 438/622; 438/623; 438/624; 438/625
(58) Field of Classification Search ........................ None
See application file for complete search history.

(56) References Cited

U.S. PATENT DOCUMENTS

| | | | |
|---|---|---|---|
| 7,671,442 B2 * | 3/2010 | Anderson et al. | 257/522 |
| 7,923,319 B2 * | 4/2011 | Futase et al. | 438/197 |
| 2005/0121787 A1 * | 6/2005 | Uchida | 257/751 |
| 2005/0186801 A1 * | 8/2005 | Uno et al. | 438/706 |

FOREIGN PATENT DOCUMENTS

JP  2002-9058  1/2002

* cited by examiner

*Primary Examiner* — Duy Deo
(74) *Attorney, Agent, or Firm* — Smith, Gambrell & Russell, LLP

(57) ABSTRACT

An object of the present invention is to obtain a favorable etching shape in etching an organic film formed on a substrate.
A semiconductor device manufacturing method according to the present invention comprises the steps of: etching with plasma a silicon-containing film and transferring a pattern of a pattern mask stacked on the silicon-containing film onto the silicon-containing film to form a patterned silicon-containing film; removing the pattern mask using plasma to expose the surface of the silicon-containing film; and etching the surface of the organic film through the patterned silicon-containing film by use of oxygen active species in plasma to form a concave portion on the organic film. Thereafter, the silicon-containing film is sputtered to form silicon-containing protection films on the inner wall surfaces of the concave portion. The concave portion is further etched in its depth direction through the patterned silicon-containing film by use of oxygen active species in plasma. Thus, the concave portion can be further etched while the side walls of the concave portion are protected from active oxygen species.

11 Claims, 12 Drawing Sheets

US 8,071,473 B2

SEMICONDUCTOR DEVICE MANUFACTURING METHOD AND STORAGE MEDIUM

CROSS-REFERENCE TO RELATED APPLICATION

The present patent application claims the benefits of Japanese Patent Application No. 2007-21302, filed on Aug. 17, 2007, and U.S. Provisional Application No. 60/996,022, filed on Oct. 25, 2007. The entire contents of these prior applications are incorporated herein by reference.

BACKGROUND OF THE INVENTION

1. Field of the Invention

The present invention relates to a technique of using plasma to etch an organic film used for a semiconductor device.

2. Description of the Related Art

When a cylinder hole or contact hole is formed in a semiconductor device manufacturing process, a mask having a multilayer structure is used because of the large aspect ratio and large depth of such a hole. An example of such a mask is one which is formed with the steps of: stacking an organic film and an $SiO_2$ film (silicon oxide film) on an insulating film subjected to etching, for example, an $SiO_2$ film; and performing dry development on this laminated film using a photoresist.

An example of the dry development is explained below with reference to FIGS. 12(a) to 12(c). Reference numeral 1 in FIG. 12A denotes a laminated structure which includes an organic film 12 composed mainly of carbon, an $SiO_2$ film 13, and a photoresist (PR) film 14 stacked in this order from the bottom upward. Photolithography is performed on the photoresist film 14 to form a resist pattern 15. First, a gas for etching such as $CF_4$ is converted to plasma. The $SiO_2$ film 13 is then etched along the resist pattern 15 with the plasma to form a mask pattern 16 on the $SiO_2$ film 13 (FIG. 12(b)). Next, $O_2$ gas alone or a mixed $O_2$ gas with $H_2$ gas or $N_2$ gas added thereto is converted to plasma. Then, the organic film 12 is etched (ashed) through the mask pattern 16 to form a mask pattern 17 for etching an $SiO_2$ film 11 which is the underlayer of the organic film 15 (FIG. 12(c)).

The organic film 15 is decomposed into $CO_2$, $H_2O$, and the like by oxygen radicals. The oxygen radicals have a strong propensity to etch the organic film 12 in an isotropic manner, that is, in the lateral direction as well as in the depth direction. As shown in FIG. 12(c), the mask pattern 17 may form into an arch shape in which the vertical cross-section of the pattern laterally spreads, called a bowing shape, which reduces the degree of verticality of the side walls 18 of the mask pattern 17. As a result, when the $SiO_2$ film 11, a film to be etched, is etched with the $SiO_2$ film 13 and the organic film 12 as a mask, the anisotropic shape of the organic film 12 is transferred onto that film to be etched, resulting in a degraded shape of a hole formed in the film etched ($SiO_2$ film 11).

In order to prevent the mask pattern 17 from having the bowing shape, in some cases, a CF- or CH-based gas as well as an $O_2$ gas are converted to plasma, and the organic film 12 is etched. At the same time, chemical compounds produced from these gases are adhered to the side walls 18 of the mask pattern 17 to form protection films for protecting the organic film 12 against the oxygen radicals. Still in those cases, occasionally, the lateral etching caused by the oxygen radicals cannot be sufficiently restrained, resulting in the bowing shape.

In the case where the organic film 12 itself is etched as a film to be etched, the photoresist film 14 is, in some cases, directly formed on the organic film 12 without forming the $SiO_2$ film 13 thereon, and the organic film 12 is etched along the resist pattern 15. However, since the photoresist film 14 is composed of organic substances, the photoresist film 14 is also etched when the organic film 12 is etched, resulting in a distorted pattern shape. This prevents the inherent shape of the resist pattern 15 from being normally transferred onto the organic film 12. For example, the shape of the hole in the organic film 12, which is a film subjected to etching, may become bow-shaped or bottom-spread. With the above-mentioned laminated structure 1, the $SiO_2$ film 13, which is an inorganic film, provided between the photoresist film 14 and the organic film 12 can prevent the upper side of the mask pattern 17 from being exposed to the oxygen plasma. However, if the thickness of an inorganic film provided is small, the upper side of the mask pattern 17 is likely to be exposed to the oxygen plasma as in a case where there is no inorganic film. In this case, the bowing shape is likely to occur. Therefore, in order to control the shape of the mask pattern 17, it is necessary to consider a suitable thickness also for the inorganic film.

Japanese Patent Laid-open, JP-A-2002-9058, discloses a technique for forming protection films on the side walls of a pattern when an organic film is etched. However, the protection films do not contain silicon, and thus the technique cannot solve the above-mentioned problem.

SUMMARY OF THE INVENTION

The present invention was devised to solve the above-mentioned problem. An object of the present invention is to provide a semiconductor device manufacturing method and a storage medium that can obtain a favorable etching shape when an organic film formed on a substrate is etched in order to manufacture a semiconductor device.

The present invention is a semiconductor device manufacturing method for etching with plasma a substrate having an organic film, a silicon-containing film on the organic film, and a pattern mask on the silicon-containing film to form a hole or groove in the organic film, the method comprising the steps of: preparing a substrate having an organic film, a silicon-containing film on the organic film, and a pattern mask on the silicon-containing film; etching with plasma the silicon-containing film of the substrate and transferring a pattern of the pattern mask onto the silicon-containing film to form a patterned silicon-containing film; removing the pattern mask using plasma to expose the surface of the silicon-containing film; etching the surface of the organic film through the patterned silicon-containing film by use of an oxygen active species in plasma to form on the organic film a concave portion having a depth that is smaller than the thickness of the organic film; sputtering the silicon-containing film to form silicon-containing protection films on the inner wall surfaces of the concave portion; and further etching the concave portion of the organic film, on which the protection films are formed, in the depth direction of the concave portion through the patterned silicon-containing film by use of an oxygen active species in plasma to form a hole or groove.

The present invention is a semiconductor device manufacturing method wherein the pattern mask is composed of a photoresist film.

The present invention is a semiconductor device manufacturing method wherein the step of transferring a pattern of the pattern mask onto the silicon-containing film includes the steps of: over-etching the silicon-containing film and etching the surface of the organic film to form the concave portion; and etching and removing only a part of the pattern mask.

The present invention is a semiconductor device manufacturing method wherein the step of removing the pattern mask uses plasma produced from a gas including a gas for sputtering a silicon-containing film.

The present invention is a semiconductor device manufacturing method wherein the step of etching the concave portion in its depth direction to form a hole or groove on the organic film uses plasma produced from a gas including a gas for sputtering a silicon-containing film.

The present invention is a semiconductor device manufacturing method wherein the gas for sputtering a silicon-containing film includes a gas composed of Ar, Xe, or He.

The present invention is a semiconductor device manufacturing method for etching with plasma a substrate having an organic film, a silicon-containing film on the organic film, and a pattern mask on the silicon-containing film to form a hole or groove in the organic film, the method comprising the steps of: preparing a substrate having an organic film; forming on the organic film provided on the substrate a silicon-containing film having a thickness that is at least one fifth of the thickness of the organic film; forming on the silicon-containing film a pattern mask for etching the silicon-containing film; etching with plasma the silicon-containing film of the substrate and transferring a pattern of the pattern mask onto the silicon-containing film to form a patterned silicon-containing film; removing the pattern mask using plasma to expose the surface of the silicon-containing film; etching the surface of the organic film through the patterned silicon-containing film by use of an oxygen active species in plasma to form on the organic film a concave portion having a depth that is smaller than the thickness of the organic film; sputtering the silicon-containing film to form silicon-containing protection films on the inner wall surfaces of the concave portion; and further etching the concave portion of the organic film, on which the protection films are formed, in the depth direction of the concave portion through the patterned silicon-containing film by use of an oxygen active species in plasma to form a hole or groove.

The present invention is a semiconductor device manufacturing method wherein the pattern mask is composed of a photoresist film.

The present invention is a semiconductor device manufacturing method wherein after forming the concave portion on the organic film, the method further comprises the steps of: forming the protection films on the concave portion; and etching the concave portion formed on the organic film in the depth direction of the concave portion; the steps being repeated in this order to form a hole or groove.

The present invention is a storage medium for storing a computer program which instructs a computer to perform a semiconductor device manufacturing method, wherein the semiconductor device manufacturing method etches with plasma a substrate having an organic film, a silicon-containing film on the organic film, and a pattern mask on the silicon-containing film to form a hole or groove in the organic film, the method comprising the steps of: preparing a substrate having an organic film, a silicon-containing film on the organic film, and a pattern mask on the silicon-containing film; etching with plasma the silicon-containing film of the substrate and transferring a pattern of the pattern mask onto the silicon-containing film to form a patterned silicon-containing film; removing the pattern mask using plasma to expose the surface of the silicon-containing film; etching the surface of the organic film through the patterned silicon-containing film by use of an oxygen active species in plasma to form on the organic film a concave portion having a depth that is smaller than the thickness of the organic film; sputtering the silicon-containing film to form silicon-containing protection films on the inner wall surfaces of the concave portion; and further etching the concave portion of the organic film, on which the protection films are formed, in the depth direction of the concave portion through the patterned silicon-containing film by use of an oxygen active species in plasma to form a hole or groove.

The present invention is a storage medium for storing a computer program which instructs a computer to perform a semiconductor device manufacturing method, wherein the semiconductor device manufacturing method etches with plasma a substrate having an organic film, a silicon-containing film on the organic film, and a pattern mask on the silicon-containing film to form a hole or groove on the organic film, the method comprising the steps of: preparing a substrate having an organic film; forming on the organic film provided on the substrate a silicon-containing film having a thickness that is at least one fifth of the thickness of the organic film; forming on the silicon-containing film a pattern mask for etching the silicon-containing film; etching with plasma the silicon-containing film of the substrate and transferring a pattern of the pattern mask onto the silicon-containing film to form a patterned silicon-containing film; removing the pattern mask using plasma to expose the surface of the silicon-containing film; etching the surface of the organic film through the patterned silicon-containing film by use of an oxygen active species in plasma to form on the organic film a concave portion having a depth that is smaller than the thickness of the organic film; sputtering the silicon-containing film to form silicon-containing protection films on the inner wall surfaces of the concave portion; and further etching the concave portion of the organic film, on which the protection films are formed, in the depth direction of the concave portion through the patterned silicon-containing film by use of an oxygen active species in plasma to form a hole or groove.

In accordance with one aspect of the present invention, the silicon-containing film provided on the organic film is sputtered to form silicon-containing protection films on the side walls of the concave portion formed on the organic film, and in this case, the concave portion is etched in its depth direction using plasma. Therefore, as shown in experimental results to be mentioned later, isotropic etching by oxygen active species can be restrained, whereby a concave portion having a high degree of verticality can be formed on the organic film.

In accordance with another aspect of the present invention, a silicon-containing film is formed on the organic film provided on the substrate such that the thickness of the silicon-containing film is at least one fifth of the thickness of the organic film. In addition, the silicon-containing film is sputtered to form silicon-containing protection films on the side walls of the concave portion formed on the organic film. Therefore, as shown in experimental results to be mentioned later, isotropic etching by active oxygen species can be restrained, whereby a concave portion having a high degree of verticality can be formed on the organic film.

DETAILED DESCRIPTION OF THE PREFERRED EMBODIMENTS

Figure 1:
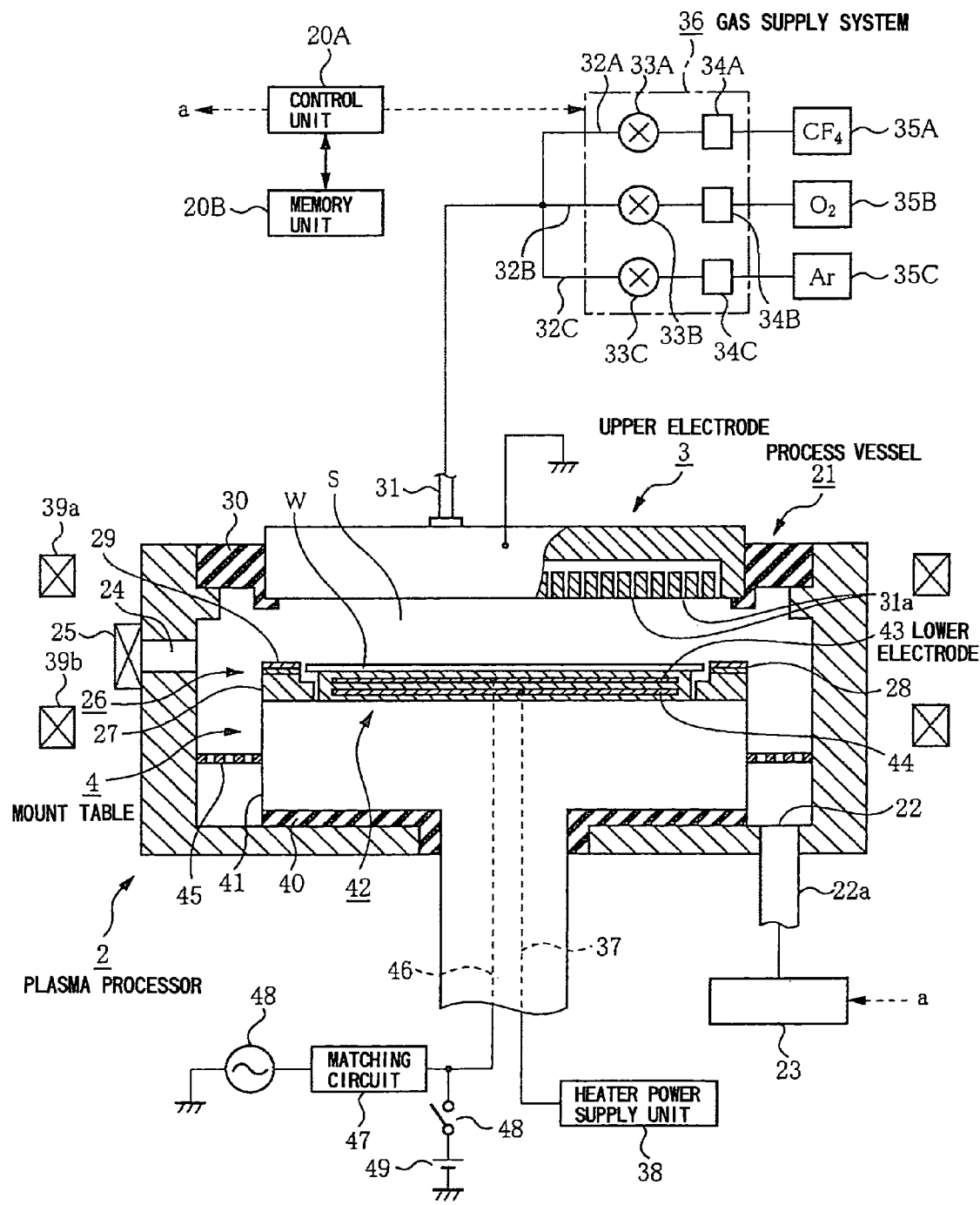
FIG. 1 is a vertical cross-sectional view showing an example of a plasma processor for performing a semiconductor device manufacturing method according to the present invention.

The following explains, with reference to FIG. 2(a), a film structure formed on the surface of a semiconductor wafer (hereinafter referred to as wafer) W which is a substrate to be processed by a plasma processor (plasma processing apparatus) 2 shown in FIG. 1. The film structure is utilized in a first embodiment. An $SiO_2$ film 51, an insulating film, is provided on the wafer W. An organic film 52 composed mainly of carbon is formed on the $SiO_2$ film 51. An $SiO_2$ film 53, a silicon-containing film, is formed on the organic film 52. The silicon-containing film is an inorganic film composed mainly of silicon. The silicon-containing film includes not only an $SiO_2$ film but also an SiN film (silicon nitride) and a film composed of SiON, Poly-Si (polycrystal Si), and the like. Also included is a film composed only of silicon; however, this film does not mean a film into which silicon is unavoidably mixed during its film formation. A photoresist (PR) film 54 constituting a pattern mask is stacked on the $SiO_2$ film 53. The photoresist film 54 is exposed to light emitted from an ArF light source and then developed. A resist pattern 55 is formed, and the $SiO_2$ film 53 is exposed at the bottom of the resist pattern 55. An appropriate thickness of the photoresist film 54 formed is such that, as described later, the photoresist film 54 does not disappear during over-etching of the $SiO_2$ film 53 and the photoresist film 54 becomes as thin as possible upon completion of the over-etching of the $SiO_2$ film 53.

The plasma processor (plasma processing apparatus) 2 which performs the semiconductor device manufacturing method according to the present invention will be explained below with reference to FIG. 1. The plasma processor 2 is provided with a process vessel 21 sealed hermetically. An exhaust port 22 is provided at the bottom of the process vessel 21. The exhaust port 22 is connected with exhaust means 23 through an exhaust path 22a. A control unit 20A controls the discharge volume to ensure that the inside of the process vessel 21 is maintained at a predetermined pressure. Reference numeral 24 in FIG. 1 denotes a transfer port that can be freely opened and closed by a gate valve 25.

An upper electrode 3 which serves also as a gas shower head is provided in the process vessel 21. A number of gas diffusion holes 31a are formed on the underside surface of the upper electrode 3 to supply process gas to the entire surface of the wafer W located below the gas diffusion holes 31a. A gas introduction pipe 31 which communicates with the gas diffusion holes 31a branches into, for example, three on its upstream side to form branch pipes 32A to 32C. The branch pipes 32A to 32C are connected to gas supply sources 35A to 35C through valves 33A to 33C and flow rate control units 34A to 34C, respectively. The valves 33A to 33C and the flow rate control units 34A to 34C constitute a gas supply system 36 and control the flow rate and on/off of gas of the gas supply sources 35A to 35C by means of a control signal from the control unit 20A to be described later. In this example, the gas supply sources 35A, 35B, and 35C supply $CF_4$ gas, $O_2$ gas, and Ar gas (gas for sputtering), respectively. Reference numeral 30 in FIG. 1 denotes an insulating member provided to electrically insulate the upper electrode 3 from the process vessel 21 sufficiently.

In the process vessel 21, a mount table 4 is also provided in such a way that the upper face of the table faces the upper electrode 3. The mount table 4 is electrically insulated from the process vessel 21 sufficiently by an insulating member 40. The mount table 4 is provided with a cylindrical support portion 41 composed of, for example, aluminum or the like and with a mount plate 42 provided on the top surface of the support portion 41 on which the wafer W is placed. The mount plate 42 is formed as a dielectric body, that is, a dielectric plate composed of, for example, ceramics such as an aluminum nitride or the like. In the mount plate 42, a foil-like electrode (lower electrode) 43 is provided on its upper surface side, and a mesh-like heater 44 on its lower surface side. Reference numeral 45 in FIG. 1 denotes an exhaust ring having a number of passage holes formed on the surface thereof. The passage holes are formed in order to uniformly exhaust process gas in the circumferential direction of the wafer W from its circumferential edge. Although not shown, substrate support pins that can vertically move the wafer W while supporting it from the back surface side thereof are provided such that they can freely project from and retract into the mount table 4. The wafer W is transferred to the mount table 4 through a cooperative action between a wafer transfer arm entering the device from the outside and the substrate support pins.

One end of a power feed rod 46 is connected to the lower electrode 43. The other end of the power feed rod 46 is connected to a high-frequency power supply 48 for plasma generation through a matching circuit 47. The power feed rod 46 branches before the matching circuit 47. The end of the branching path is connected to a DC power supply 49 for an electrostatic chuck through a switch 48. That is, the lower electrode 43 serves as an electrode for applying a high-frequency voltage and as an electrode for the electrostatic chuck. Therefore, the lower electrode 43 and a dielectric portion thereabove constitute the electrostatic chuck for supporting the wafer W through electrostatic adsorption. Also, the above-mentioned heater 44 is connected to a heater power supply unit 38 through a conduction rod 37. In addition, a high-frequency power supply (not shown) for bias is connected to the lower electrode 43 through the matching circuit 47. As mentioned later, when the high-frequency power supply 48 is turned on for plasma generation, the high-frequency power supply for bias is also turned on. Correspondingly, a high-frequency voltage for bias is applied to the lower electrode 43.

A focus ring 26, which is a ring portion for plasma control, is provided so as to surround the circumferential edge of the wafer W supported on the surface of the mount plate 42 by absorption. The focus ring 26 is composed of a ring member 27, an adhesion layer 28, and a ring-like sheet 29. The ring member 27 is composed of an insulator such as quartz. The adhesion layer 28 is formed on the top surface of the ring member 27. The ring-like sheet 29 is detachably provided on the top surface of the adhesion layer 28 for plasma control. The sheet 29 includes an organic resin like a polyimide, a substance which dissociates, when exposed to plasma, a component that reacts with plasma active species like chlorine radicals, which component is, for example, carbon such as carbon radicals or the like. Carbon radicals generated during plasma processing react with fluorine radicals in the vicinity of the circumferential edge of the wafer W to generate a compound not having etching action, for example, $CF_x$ (X=1, 2, 3, 4). During the processing, the generated compound is removed by an exhaust stream flowing from the central part of the wafer W to its circumferential edge. This prevents a density difference in fluorine radicals between the vicinity of the circumferential edge of the wafer W and its inner region, making it possible to etch the wafer W at an etching speed at which a high in-plane uniformity is ensured.

Two ring-like magnets 39a and 39b are provided above and below the transfer port 24, respectively, so as to surround the process vessel 21. The magnets form a magnetic field around a processing space S between the upper electrode 3 and the mount table 4 and confine plasma in the processing space S.

The plasma processor 2 is provided with the control unit 20A which includes, for example, a computer. The control unit 20A also includes a program, a memory, a data processing unit composed of a CPU, and the like. The program contains instructions which instruct the control unit 20A to send a control signal to each section of the plasma processor 2 and to proceed with each step to be mentioned later so that plasma processing is performed for the wafer W. The memory includes, for example, an area for storing processing parameters such as processing pressures, processing times, gas flow rates, and electric power values. When the CPU executes each instruction of the program, these processing parameters are read, and a control signal associated with each of the parameter values is sent to each part of the plasma processor 2. This program (including a program for the input operation and display of the processing parameters) is stored in a memory unit 20B and then installed in the control unit 20A. The memory unit 20B is a computer storage medium, such as a flexible disk, a compact disk, an MO (magneto-optical) disk, and the like.

First Embodiment

As a first embodiment of a semiconductor device manufacturing method according to the present invention using the plasma processor (plasma processing apparatus) 2, the following explains a process of forming a mask pattern for etching the organic film 52 to further etch the $SiO_2$ film 51 which is the underlayer of the organic film 52. First of all, the gate valve 25 is opened to load the wafer W into the process vessel 21 by means of a transfer mechanism (not shown). The wafer W is horizontally placed on the mount table 4 and fixed to the mount table 4 through electrostatic absorption. The transfer mechanism is then retracted from the process vessel 21, and the gate valve 25 is closed. Subsequently, a temperature control mechanism (not shown) adjusts temperatures of the portion above, the middle height portion of, and the portion below the wafer W to 60, 60, and 20 degrees, respectively. Thereafter, the following steps are performed, for example.

(Step S1: Etching the $SiO_2$ film 53)

While the exhaust means 23 exhausts the process vessel 21 through the exhaust port 22, for example, $CF_4$ (carbon tetrafluoride) gas is supplied at a flow rate of 150 sccm from the gas supply system 36 to the process vessel 21 through the upper electrode 3, and the inside of the process vessel 21 is maintained at a predetermined vacuum degree of, for example, 10.7 Pa (80 mTorr). When a high-frequency voltage having a predetermined frequency is applied at a rate of 1500 W from the high-frequency power supply 48 through the matching circuit 47 to the lower electrode 43, the $CF_4$ gas is converted to plasma. Then, the surface of the photoresist film 54 is etched. At the same time, the $SiO_2$ film 53 is etched along the resist pattern 55 with the photoresist film 54 as a mask. As a result, a mask pattern 56 is formed in the $SiO_2$ film 53. As shown in FIG. 2(b), the $SiO_2$ film 53 is over-etched, the organic film 52 is exposed at the bottom of the mask pattern 56, and then the surface of the organic film 52 is further etched. The high-frequency power supply 48 is turned off to stop the $CF_4$ gas supply at such a time point that a concave portion 57a corresponding to the mask pattern 56 has been formed on the organic film 52.

Step S1 is performed with the following objectives: first, to form the photoresist film 54 as thin as possible to reduce the processing time for the removal of the photoresist film 54 in Step S2 so that the exposed organic film 52 may not be etched laterally by oxygen radicals, and secondly to form the concave portion 57a in Step S1 by etching the organic film 52 with anisotropic $CF_4$ so that protective films that reliably protect the side walls of the concave portion 57a can be formed in Step S2 and Step S3.

(Step S2: Removing the Photoresist Film)

The process vessel 21 is exhausted by means of the exhaust means 23 to remove the residual $CF_4$ gas and active species thereof from the processing space S. The process vessel 21 continues to be exhausted at a predetermined rate. At the same time, $O_2$ (oxygen) gas and Ar (argon) gas are supplied at a flow rate of 90 sccm and 150 sccm, respectively, from the gas supply system 36 to the process vessel 21 through the upper electrode 3, and the inside of the process vessel 21 is maintained at a predetermined vacuum degree of, for example, 2.0 Pa (15 mTorr). When a high-frequency voltage having a predetermined frequency is thereafter applied at a rate of 500 W from the high-frequency power supply 48 through the matching circuit 47 to the lower electrode 43, the etching gas ($O_2$ gas and Ar gas) is converted to plasma, and active species, such as oxygen radicals, Ar ions, or the like, are generated.

Figure 4:
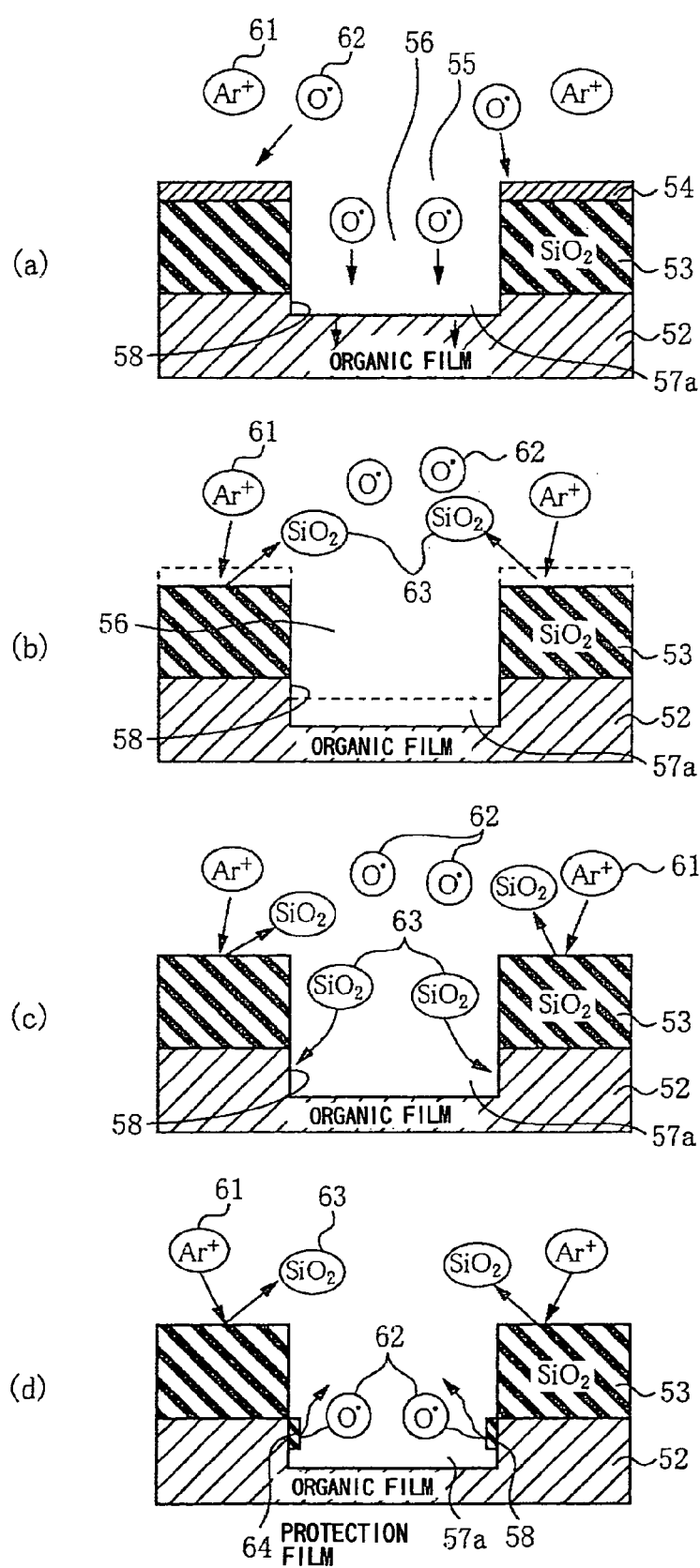
FIGS. 4(a) to 4(d) are staged cross-sectional views showing a process of forming the protection film.

As shown in FIG. 4(a), an oxygen radical 62, which is an oxygen active species generated, etches the residual photoresist film 54. The oxygen radical 62 also etches the organic film 52 on the surface of the concave portion 57a with the photoresist film 54 as a mask. When the photoresist film 54 has been removed and the $SiO_2$ film 53 exposed, the organic film 52 is subsequently etched with the $SiO_2$ film 53 as a mask. At the same time, the surface of the $SiO_2$ film 53 is sputtered with an Ar ion 61. This causes a silicon oxide 63 constituting the $SiO_2$ film 53 to emit from the $SiO_2$ film 53 (FIG. 4(b)). The silicon oxide 63 accumulates on a side wall 58 of the concave portion 57a (FIG. 4(c)) to form a protection film 64 for protecting the organic film against the etching action of the oxygen radical 62 (FIGS. 2(c) and 4(d)). After the photoresist film 54 has been removed from the entire surface of the wafer W and after a predetermined time has elapsed since the high-frequency power supply 48 was turned on, the high-frequency power supply 48 is then turned off to stop the $O_2$ gas supply. For convenience of illustration, FIG. 4(d) illustrates the protection films 64 formed seemingly on the upper portion of the side wall 58 in this process. However, the portion where the protection film 64 is formed is not limited thereto, but it may be formed, for example, on the lower portion of the side wall 58 or over the entire surface thereof. This also applies to similar processes of other embodiments to be described later.
(Step S3: Forming Protection Films)

The process vessel 21 is exhausted by the exhaust means 23 to remove the residual $O_2$ gas and active species of the $O_2$ gas and Ar gas from the processing space S. The process vessel 21 continues to be exhausted at a predetermined rate. At the same time, Ar gas is supplied from the gas supply system 36 to the process vessel 21 at a flow rate of 240 sccm, and the inside of the process vessel 21 is maintained at a predetermined vacuum degree of, for example, 2.0 Pa (15 mTorr). When a high-frequency voltage having a predetermined frequency is thereafter applied at a rate of 500 W from the high-frequency power supply 48 through the matching circuit 47 to the lower electrode 43, the Ar gas is converted to plasma, and an active species, such as the Ar ion 61, is generated.

Figure 5:
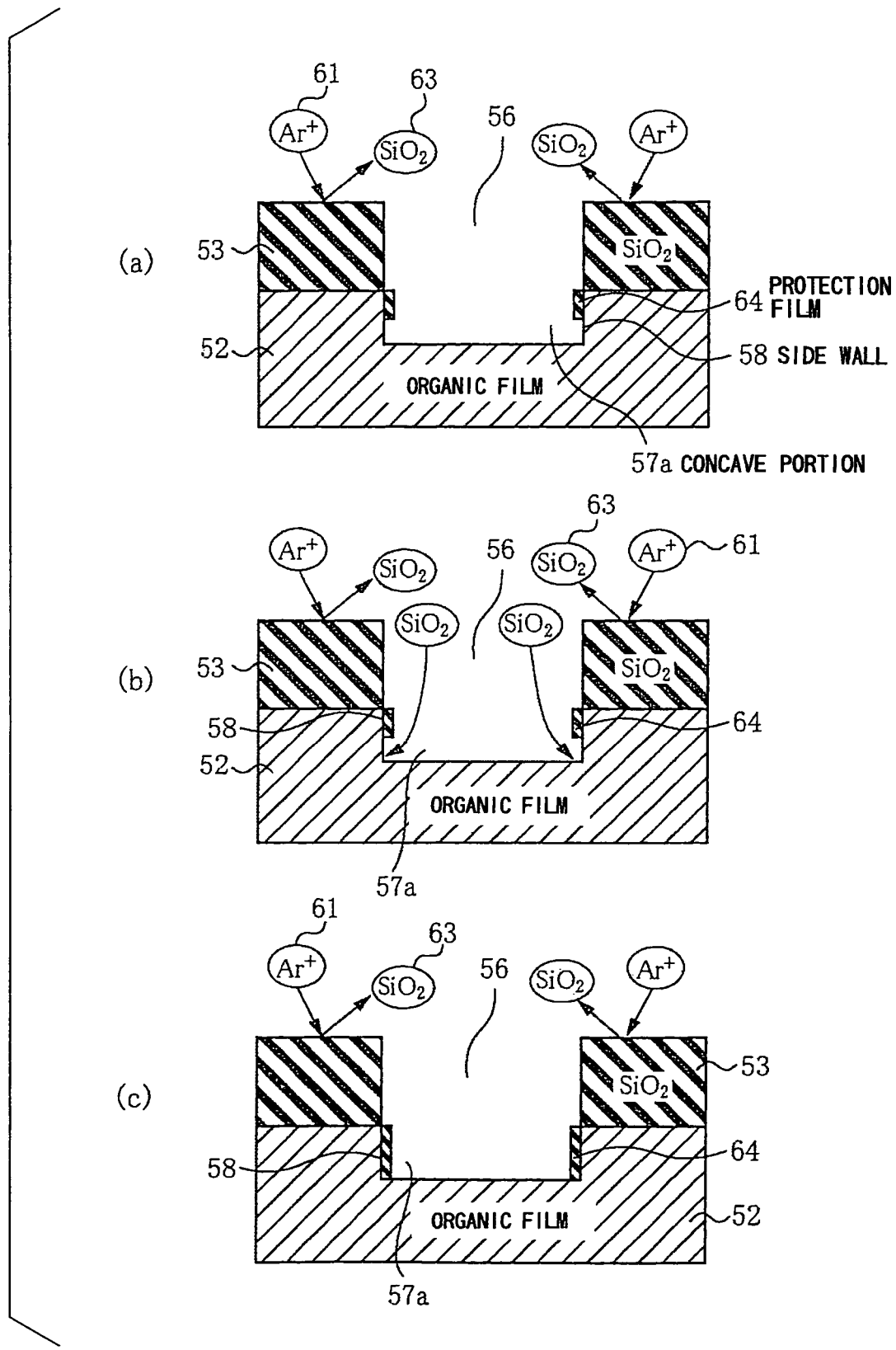
FIGS. 5(a) to 5(c) are staged cross-sectional views showing a process of forming the protection film.
Figure 6:
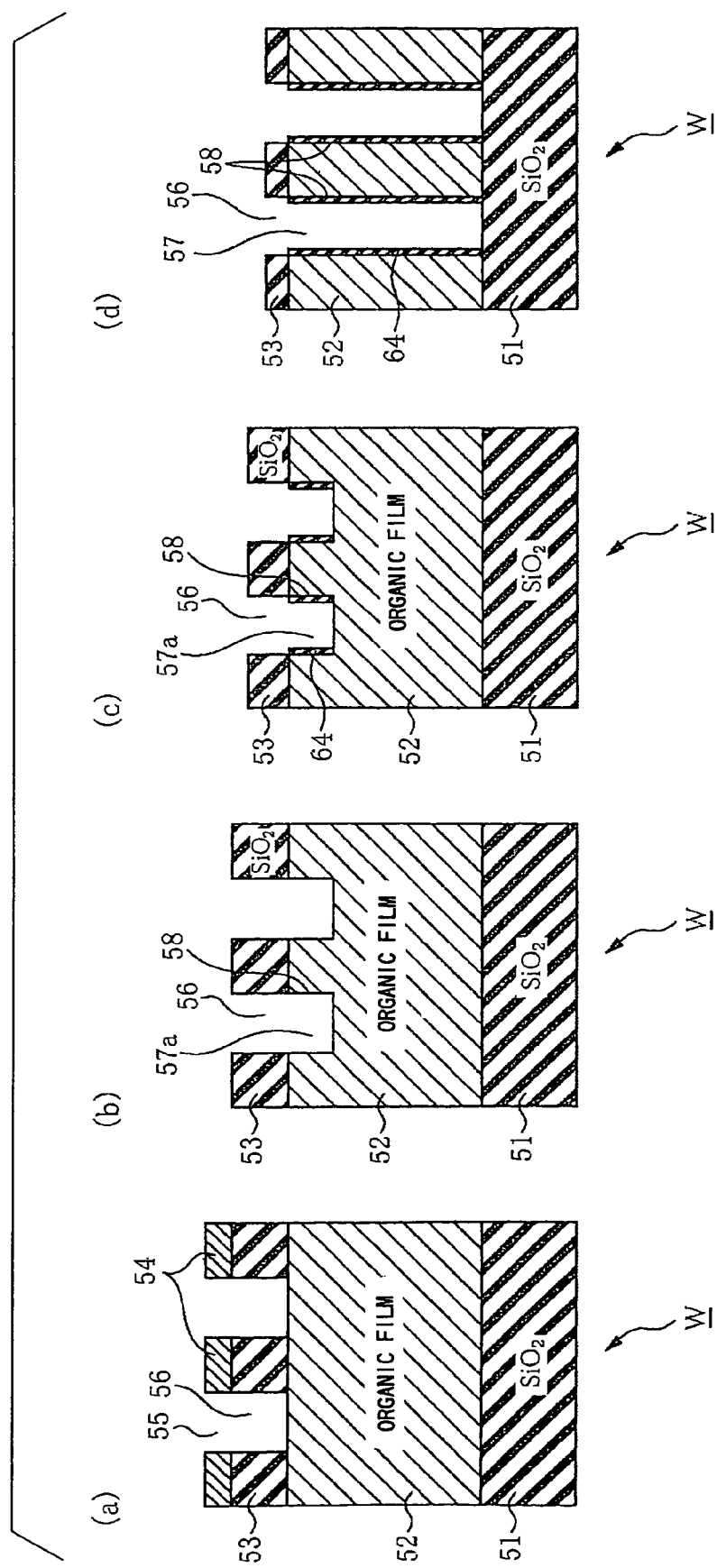
FIGS. 6(a) to 6(d) are staged cross-sectional views showing another process of forming a pattern.

Like in Step S2, the surface of the $SiO_2$ film 53 is sputtered with the generated Ar ion 61 (FIG. 5(a)). The silicon oxide 63 sputtered from the $SiO_2$ film 53 accumulates on the side wall 58 of the concave portion 57a (FIG. 5(b)). The deposited silicon oxide 63 grows into the protection film 64 (FIGS. 2(d) and 5(c)). The etching in Step S3 uses only the active species of the Ar gas without using those of the $O_2$ gas. Since the active species of the Ar gas hardly etch the organic film 52, the concave portion 57a can be prevented from spreading laterally. For example, after a predetermined time has elapsed since the high-frequency power supply 48 was turned on and after the formation of the protection film 64 has proceeded to a depth that effectively prevents a mask pattern 57 formed by the concave portion 57a from becoming bow-shaped, the high-frequency power supply 48 is turned off to improve the throughput, and the processing proceeds to the following Step S4.
(Step S4: Etching the Organic Film Using Oxygen Plasma)

Figure 3:
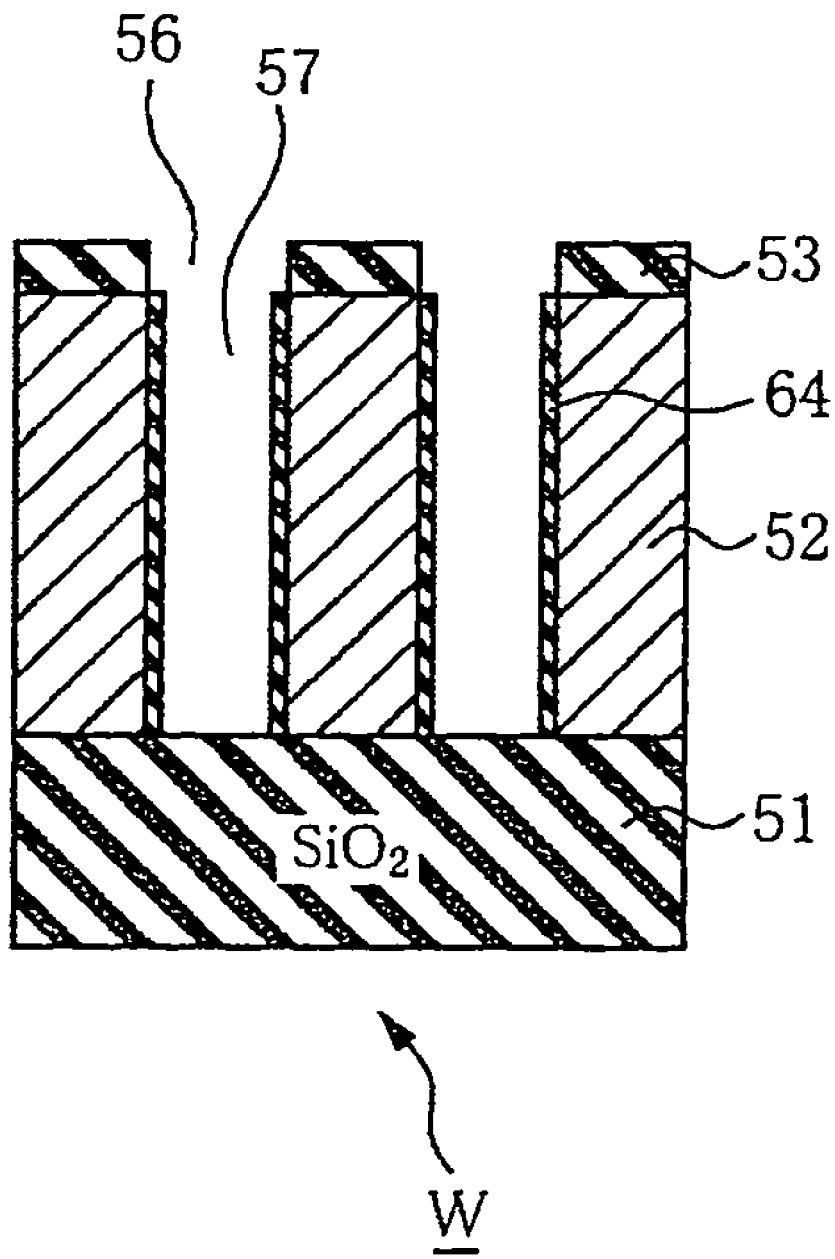
FIG. 3 is a fragmentary cross-sectional view showing a process of forming a pattern while forming protection films on the side walls of an organic film on which resist and silicon-containing films are stacked.

The process vessel 21 is exhausted by the exhaust means 23 to remove the residual active species of the Ar gas from the processing space S. The process vessel 21 continues to be exhausted at a predetermined rate. At the same time, $O_2$ gas and Ar gas are supplied at a flow rate of 90 sccm and 150 sccm, respectively, from the gas supply system 36 to the process vessel 21, and the inside of the process vessel 21 is maintained at a predetermined vacuum degree of, for example, 2.0 Pa (15 mTorr). When a high-frequency voltage having a predetermined frequency is thereafter applied at a rate of 500 W from the high-frequency power supply 48 through the matching circuit 47 to the lower electrode 43, the Ar gas and $O_2$ gas are converted to plasma, and active species, such as the Ar ion 61, the oxygen radical 62, or the like, are generated. While the organic film 52 is etched by the active species of the $O_2$ gas with the $SiO_2$ film 53 as a mask and the concave portion 57a extends in the depth direction, the $SiO_2$ film 53 is sputtered with the Ar ion 61 similarly to Step S2. The emitted silicon oxide 63 accumulates on the side wall 58 of the concave portion 57a, and the protection film 64 extends downward as the concave portion 57a extends. The concave portion 57a is etched in its depth direction while the side wall 58 of the concave portion 57a is prevented from being etched by the oxygen radical 62, which results in the mask pattern 57. As shown in FIG. 3(e), at a time point when the $SiO_2$ film 51 is exposed at the bottom of the mask pattern 57, the high-frequency power supply 48 is turned off to stop the $O_2$ gas and Ar gas supply.

In accordance with the first embodiment, the photoresist film 54 is removed to expose the $SiO_2$ film 53, the exposed $SiO_2$ film 53 is sputtered with the Ar ions, and the $SiO_2$ sputtered from the $SiO_2$ film 53 is deposited on the side walls 58 of the concave portion 57a formed on the organic film 52 to form the protection films 64. The organic film 52 is then etched using the oxygen radicals until the $SiO_2$ film 51 is exposed. The above-mentioned protection films 64 composed of $SiO_2$ prevent the side walls 58 of the concave portion 57a from being laterally etched by the oxygen radicals. Therefore, the mask pattern 57 can be formed by the highly vertical side walls 58 of the organic film 52, as shown by experiments to be mentioned later.

With the first embodiment, in Step S2, the photoresist film 54 is etched using the Ar gas and $O_2$ gas as process gases, and subsequently the $SiO_2$ film 53 is sputtered. Therefore, the protection films 64 can be formed on the side walls 58 of the concave portion 57a immediately after the photoresist film 54 is removed. Also in Step S2, the concave portion 57a is prevented from being laterally etched, thus preventing degradation of the degree of verticality of the mask pattern 57 eventually formed. In Step S4, the Ar gas and $O_2$ gas are converted to plasma, and the protection films 64 are extended toward the lower portion of the concave portion 57a with the concave portion 57a extended in its depth direction. Therefore, the degree of verticality of the mask pattern 57 can be further improved. As long as the degree of verticality of the side walls 58 of the mask pattern 57 can be sufficiently improved, the plasma processing in Steps S2 and S4 can be performed using only the $O_2$ gas instead of using the mixed gas of the Ar gas and $O_2$ gas. Further, when the silicon-containing film is sputtered, noble gases, such as Xe, He, or the like, may be used instead of the Ar gas. With the first embodiment, the organic film 52 may be a mask for etching the $SiO_2$ film 51 as mentioned above. The present embodiment can also be applied to a case where the organic film is an insulating film having a low dielectric constant, such as an SiCOH film, and a contact hole or the like is to be formed on the insulating film.

If the side walls 58 of the concave portion 57a are formed on the organic film 53 when the $SiO_2$ film 53 is sputtered with the Ar ions, the side walls 58 are protected, and the above-mentioned effects are obtained. Therefore, the present invention is not limited to the above-described procedures of the first embodiment. FIGS. 6(a) to 6(d) show a variant of the above-described embodiment. The wafer W having the same film structure as that of FIG. 2(a) is first etched according to Step S1, for example, until the organic film 53 is exposed (FIG. 6(a)). In Step S2, the wafer W is etched using only the $O_2$ gas instead of using the Ar gas and $O_2$ gas to remove the photoresist film 54. At the same time, the surface of the organic film 52 is etched to form the concave portion 57a (FIG. 6(b)). The $SiO_2$ film 53 is then sputtered according to Step S3 to form the protection films 64 on the side walls 58 of the concave portion 57a (FIG. 6(c)). Similarly to the above-described embodiment, the concave portion 57a is thereafter extended in its depth direction according to Step S4 to form the mask pattern 57 (FIG. 6(d)). When the processing is performed according to such processes, the photoresist film 54 is formed to have an appropriate thickness so that the organic film 52 is prevented from being laterally etched until the photoresist film 54 is removed.

A second embodiment will now be explained. The second embodiment explains a process of etching an organic film, which is a film subjected to etching.

(Process of Forming Each Film)

Figure 7:
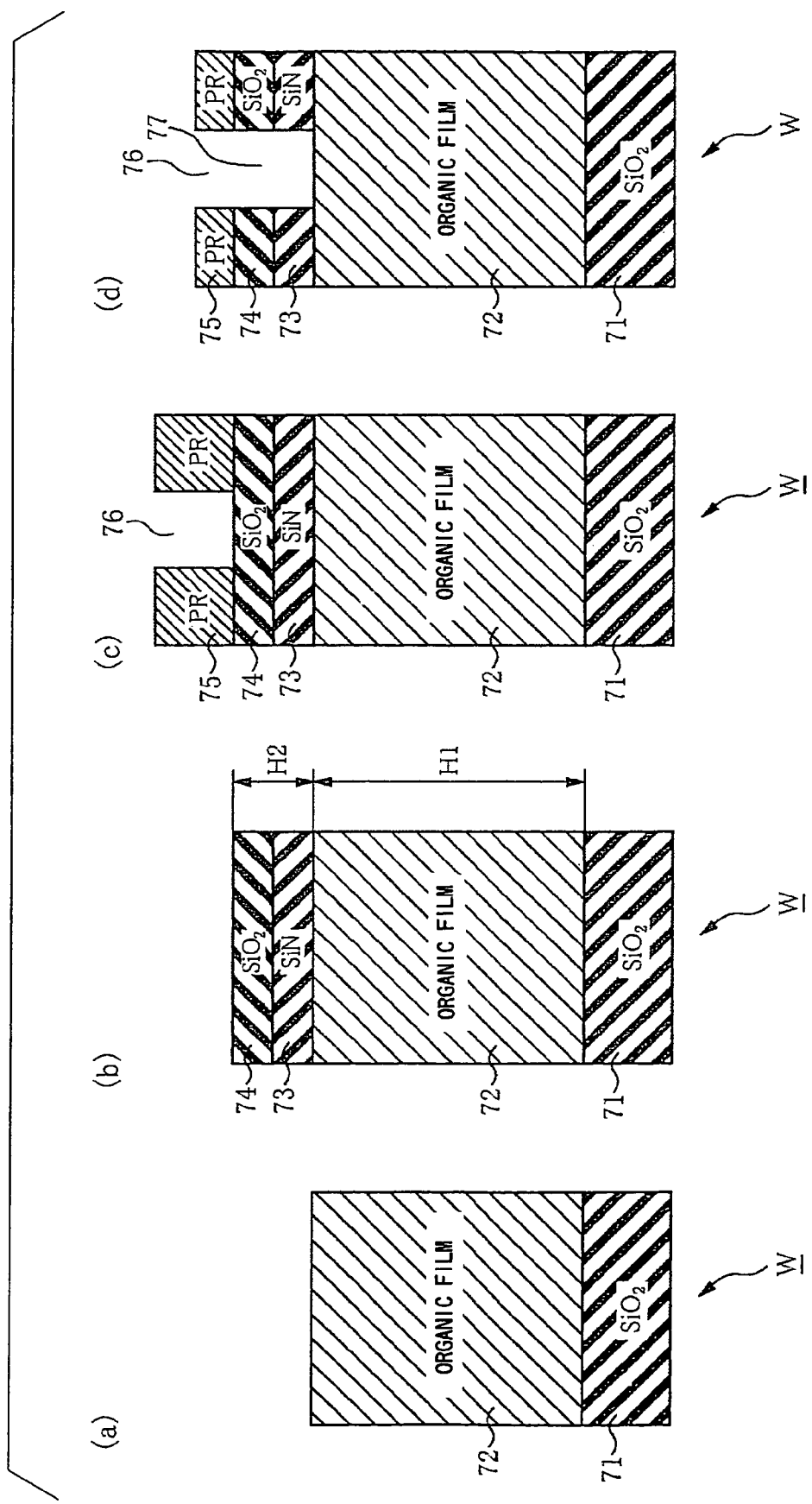
FIGS. 7(a) to 7(d) are staged cross-sectional views showing a process of forming a pattern while forming protection films on the side walls of an organic film on which resist and silicon-containing films are stacked according to another aspect of the present invention.

First, an organic film 72 composed of, for example, amorphous carbon is formed, for example, on an $SiO_2$ film 71 formed on the surface of the wafer W (FIG. 7(a)). The organic film 72 is used as a mask for etching, for example, a base film. Subsequently, an SiN film 73 and an $SiO_2$ film 74, which are silicon-containing films, are formed in this order from the bottom upward (FIG. 7(b)). When the thickness of the organic film 72 is H1, and the total thickness of each of the SiN film 73 and the $SiO_2$ film 74 is H2, the SiN film 73 and the $SiO_2$ film 74 are formed to satisfy the relation, $H2/H1 > 1/5$. The object of forming the SiN film 73 and the $SiO_2$ film 74 to such a thickness is to form protection films over the entire side walls of a pattern when the organic film is etched up to its underlayer, as explained in an evaluation test to be mentioned later. Subsequently, a resist film 75 is stacked on the $SiO_2$ film 74, and a resist pattern 76 is formed in predetermined shape such that the $SiO_2$ film 74 is exposed at the bottom of the resist film 75.

(Etching each Film)

(Step T1)

After the resist pattern 76 is formed, the wafer W is loaded into the plasma processor 2. Then, with the same procedures as Step S1 of the first embodiment, $CF_4$ gas is supplied at a flow rate of 150 sccm, and the inside of the process vessel 21 is maintained at, for example, 10.7 Pa (80 mTorr). The $CF_4$ gas is then converted to plasma. With this, the surface of the photoresist film 75 is etched. Subsequently, the $SiO_2$ film 74 and the SiN film 75 are etched along the resist pattern 76 to form a mask pattern 77 which ranges over the $SiO_2$ film 74 and the SiN film 75 (FIG. 7(d)). The plasma generation is stopped to stop the $CF_4$ gas supply, for example, at a time point when the organic film 72 is exposed.

(Step T2)

This step has the same procedures as Step S2 of the above-described embodiment. $O_2$ gas and Ar gas are supplied to the process vessel 21 at a flow rate of 90 sccm and 150 sccm, respectively, and the inside of the process vessel 21 is maintained at, for example, 2.0 Pa (15 mTorr). Then, each process gas is converted to plasma. As explained in Step S2 of the first embodiment, the photoresist film 75 is removed, and subsequently the $SiO_2$ film 74 is sputtered. At the same time, the organic film 72 is etched using the photoresist film 75 and the $SiO_2$ film 74 as a mask to form a concave portion 78a. In addition, the protection films 64 are formed on a side wall 79 of the concave portion 78a (FIG. 8(e)). After, for example, a predetermined time has elapsed since the start of the plasma generation, the plasma generation and the $O_2$ gas supply are stopped.

(Step T3)

This step has the same procedures as Step S3 of the first embodiment. Ar gas is supplied to the process vessel 21 at a flow rate of 240 sccm, and the inside of the process vessel 21 is maintained at, for example, 2.0 Pa (15 mTorr). The Ar gas is then converted to plasma. As explained in Step S3, the $SiO_2$ film 74 or the SiN film 73 is sputtered to allow the protection films 64 to grow (FIG. 8(f)). After, for example, a predetermined period of time has elapsed since the start of the plasma generation, the plasma generation is stopped.

(Step T4)

This step has the same procedures as Step S4 of the above-described embodiment. Ar gas and $O_2$ gas are supplied to the process vessel 21 at a flow rate of 150 sccm and 90 sccm, respectively, and the inside of the process vessel 21 is maintained at, for example, 2.0 Pa (15 mTorr). Then, these process gases are converted to plasma, and the concave portion 78a is etched in its depth direction so as to be extended. At the same time, the protection films 64 are extended downward (FIG. 8(g)). The plasma generation and the $O_2$ gas supply are stopped at a time point when the bottom of the concave portion 78a remains in the organic film 72 after the start of the etching.

(Step T5)

This step has the same procedures as the above-described Step T3 of the second embodiment. The Ar gas is converted to plasma, and the $SiO_2$ film 74 or the SiN film 73 is sputtered to allow the protection films 64 to grow (FIG. 8(h)). After a lapse of a predetermined time since the start of the plasma generation, the plasma generation is stopped. The pressure in the process vessel 21 and the flow rate of the Ar gas are the same as those of Step T3.

(Step T6)

This step has again the same procedures as the above-described Step T4 of the second embodiment. The Ar gas and $O_2$ gas are converted to plasma, and the concave portion 78a is etched in its depth direction so as to be extended. At the same time, as explained in the first embodiment, the $SiO_2$ film 74 or the SiN film 73 is sputtered to extend the protection films 64 further downward, thus forming a mask pattern 78. At a time point when the $SiO_2$ film 71 is exposed at the bottom of the pattern 78, the plasma generation and the supply of each process gas are stopped (FIG. 8(i)). The pressure in the process vessel 21 and the flow rate of the Ar gas are the same as those of, for example, Step T3.

In accordance with the second embodiment, as explained in evaluation tests to be mentioned later, the protection films 64 can be formed with $SiO_2$ over an area ranging from the upper portion to the lower portion of the side wall 79 of the concave portion 78a. This prevents the side walls 79 of the concave portion 78a from being laterally etched and the degree of their verticality from being degraded. Further, the relation between the thicknesses of the silicon-containing films and the thickness of the organic film in the second embodiment may be applied to the first embodiment. In the first embodiment, each film may be formed such that the thickness of the $SiO_2$ film 53 is more than 1/5 times the thickness of the organic film 52.

The second embodiment may include the steps of: sputtering the $SiO_2$ film 74 and the SiN film 73 using only the Ar gas to allow the protection films 64 to grow; and etching the concave portion 78a while forming the protection films 64 using the $O_2$ gas in addition to the Ar gas, the steps being repeated in this order. Therefore, the side walls 79 of the concave portion 78a are protected by the protection films 64 more securely, thus preventing the lateral spread of the pattern 78. The above repetitive steps may be applied to the first embodiment. That is, in the first embodiment, Steps S3 and S4 may be repeated to extend the concave portion 57a in its depth direction.

Figure 8:
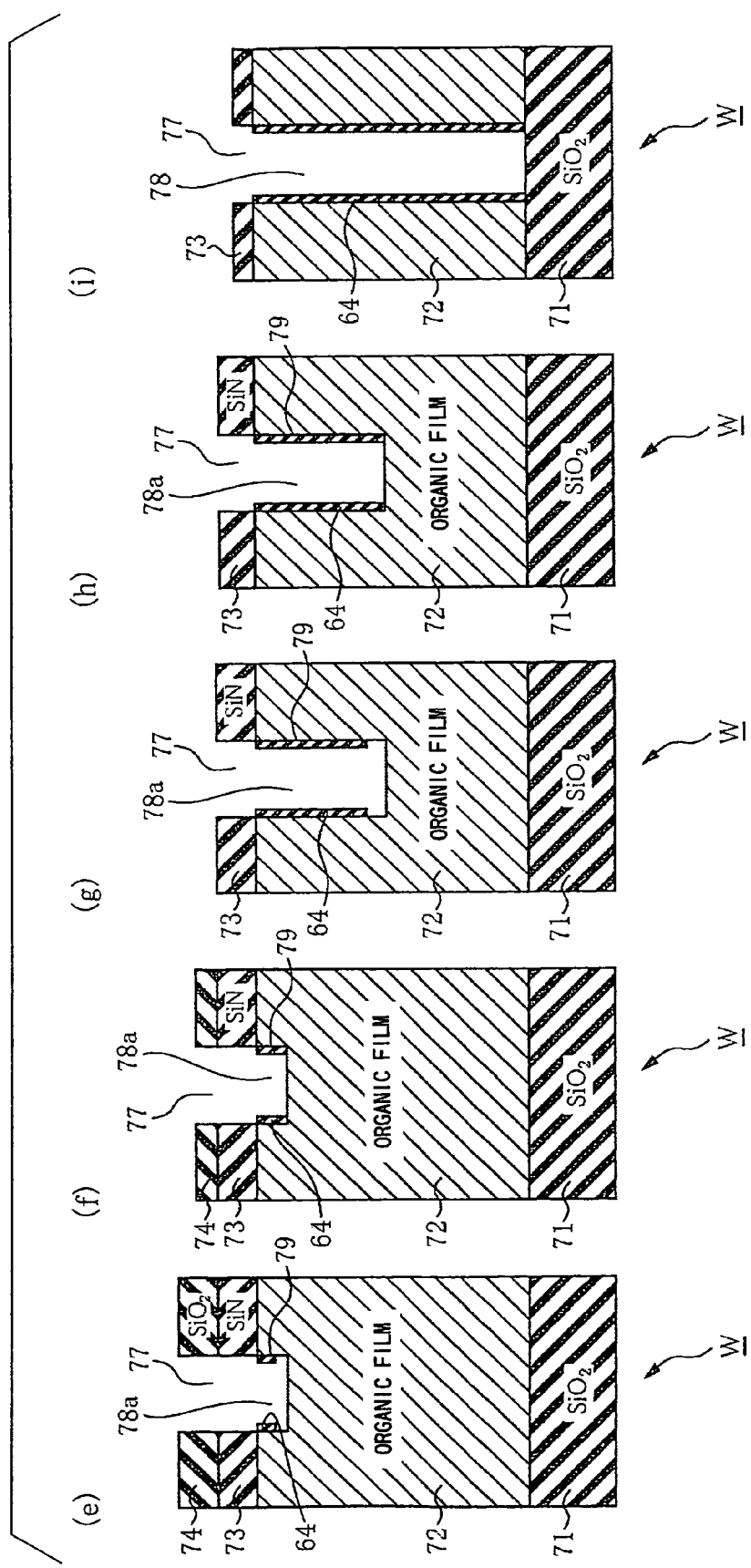
FIGS. 8(e) to 8(i) are staged cross-sectional views showing a process of forming a pattern while forming protection films on the side walls of an organic film on which resist and silicon-containing films are stacked according to another aspect of the present invention.
Figure 9:
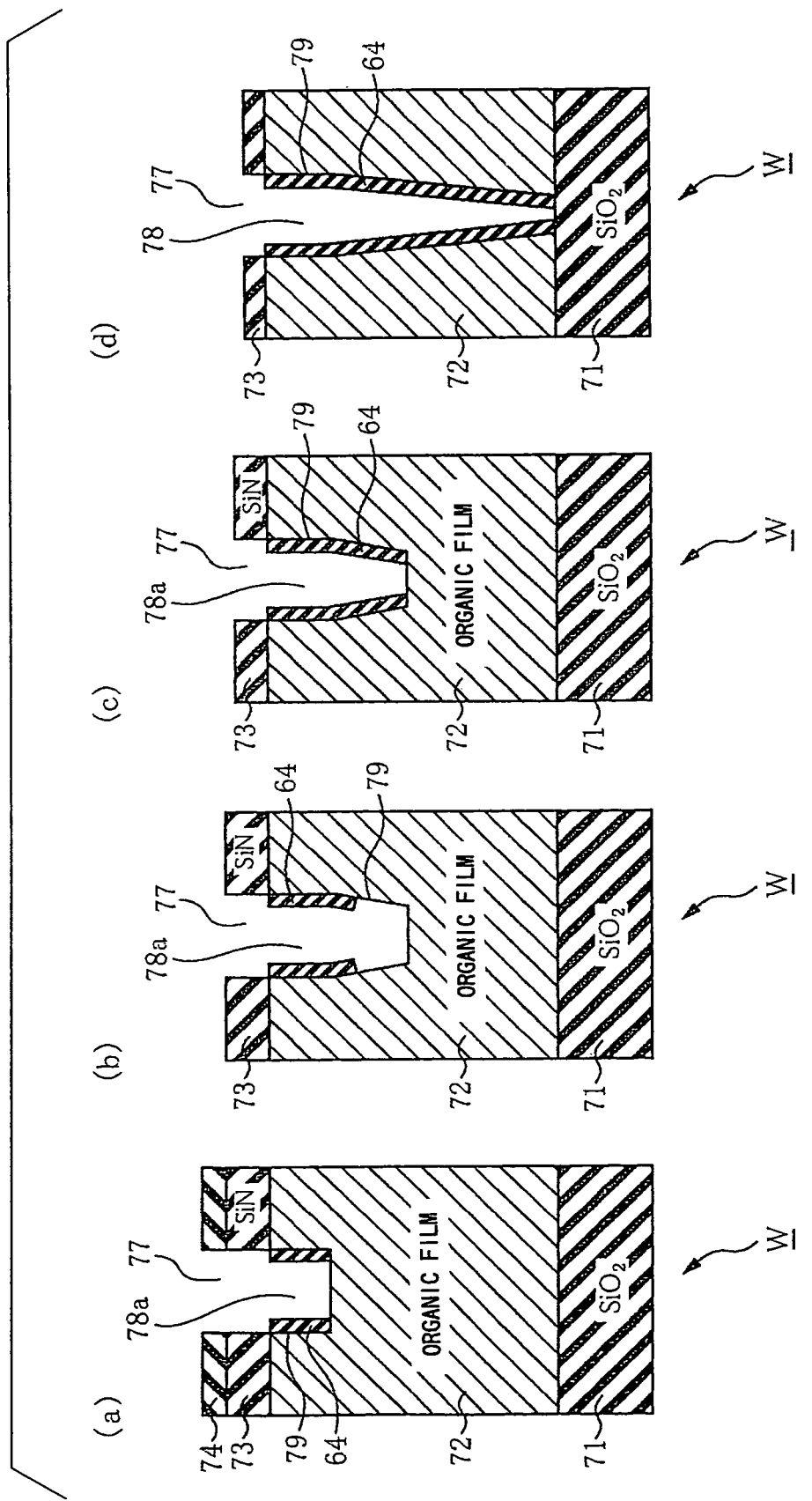
FIGS. 9(a) to 9(d) are staged cross-sectional views explaining another example of the process of forming a pattern.

Each of the above-described Steps T1 and T6 controls conditions for sputtering the $SiO_2$ film 74 and the SiN film 73 and also controls the thickness of the protection films 64 to be formed, thus forming thick protection films 64. This prevents most of plasma active species generated in each process from entering the concave portion 78a. Therefore, the width at a lower portion of the mask pattern 78 can be made smaller than that at an upper portion thereof. FIGS. 9(a) to 9(d) are schematic views of patterns formed when protection films thicker than those of FIG. 8 are formed in each of the above-mentioned steps T. FIG. 9(a) shows the concave portion 78a after completion of Step T3; FIG. 9(b) shows the same after completion of Step T4; and FIG. 9C the same after completion of Step T5. FIG. 9(d) shows the mask pattern 78 after completion of Step T6. A small width of the pattern 78 at its lower portion, as shown in FIG. 9(d), enables size reduction of a pattern to be formed on the SiO$_2$ film 71, for example, when the SiO$_2$ film 71 is etched along the pattern 78. This is preferable because the line width of a metal wire can be reduced when the metal wire is embedded in the pattern. This control of the bottom width of the pattern based on the control of the thicknesses of the protection films can also be applied to the first embodiment.

Evaluation Tests (Evaluation Test 1-1)

Figure 2:
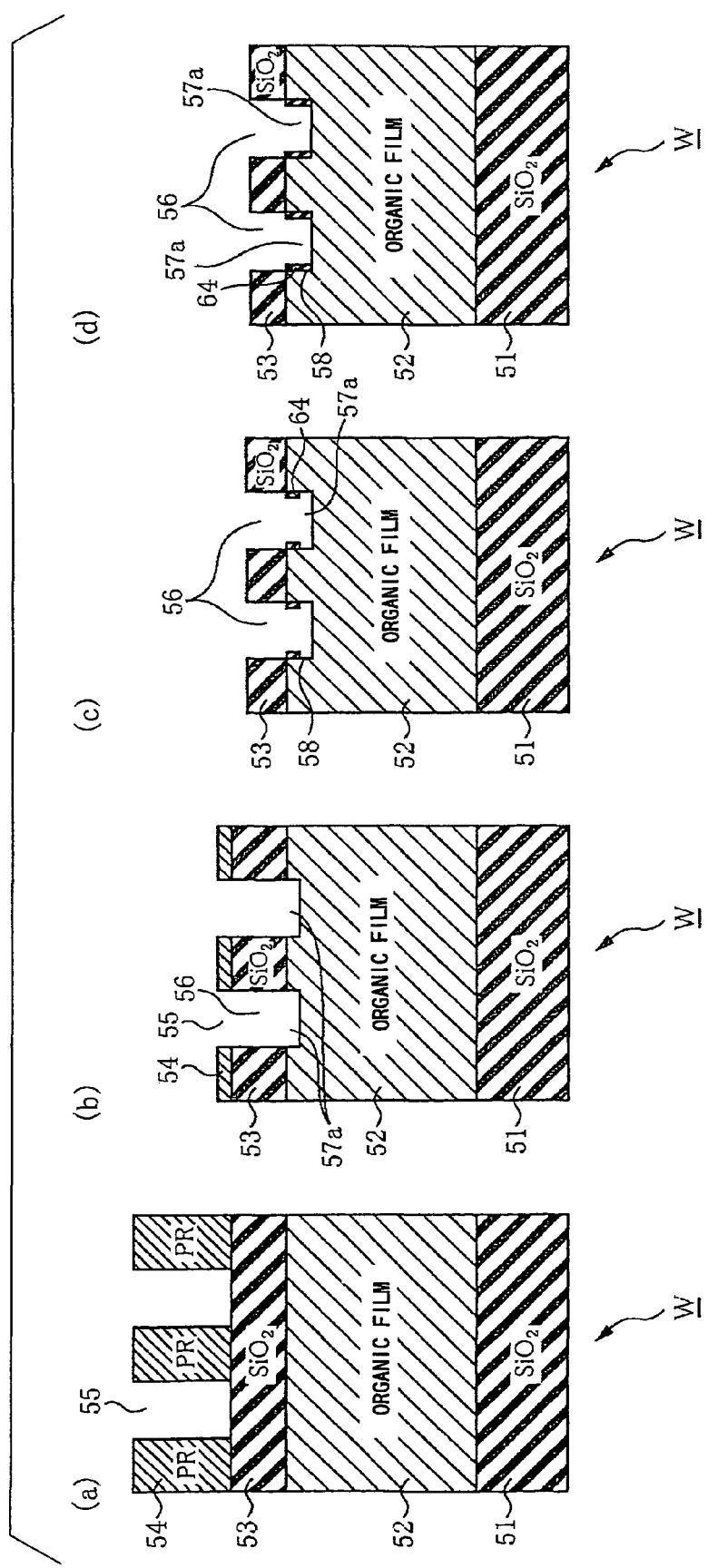
FIGS. 2(a) to 2(d) are staged cross-sectional views showing a process of forming a pattern while forming protection films on the side walls of an organic film according to the present invention.
Figure 10:
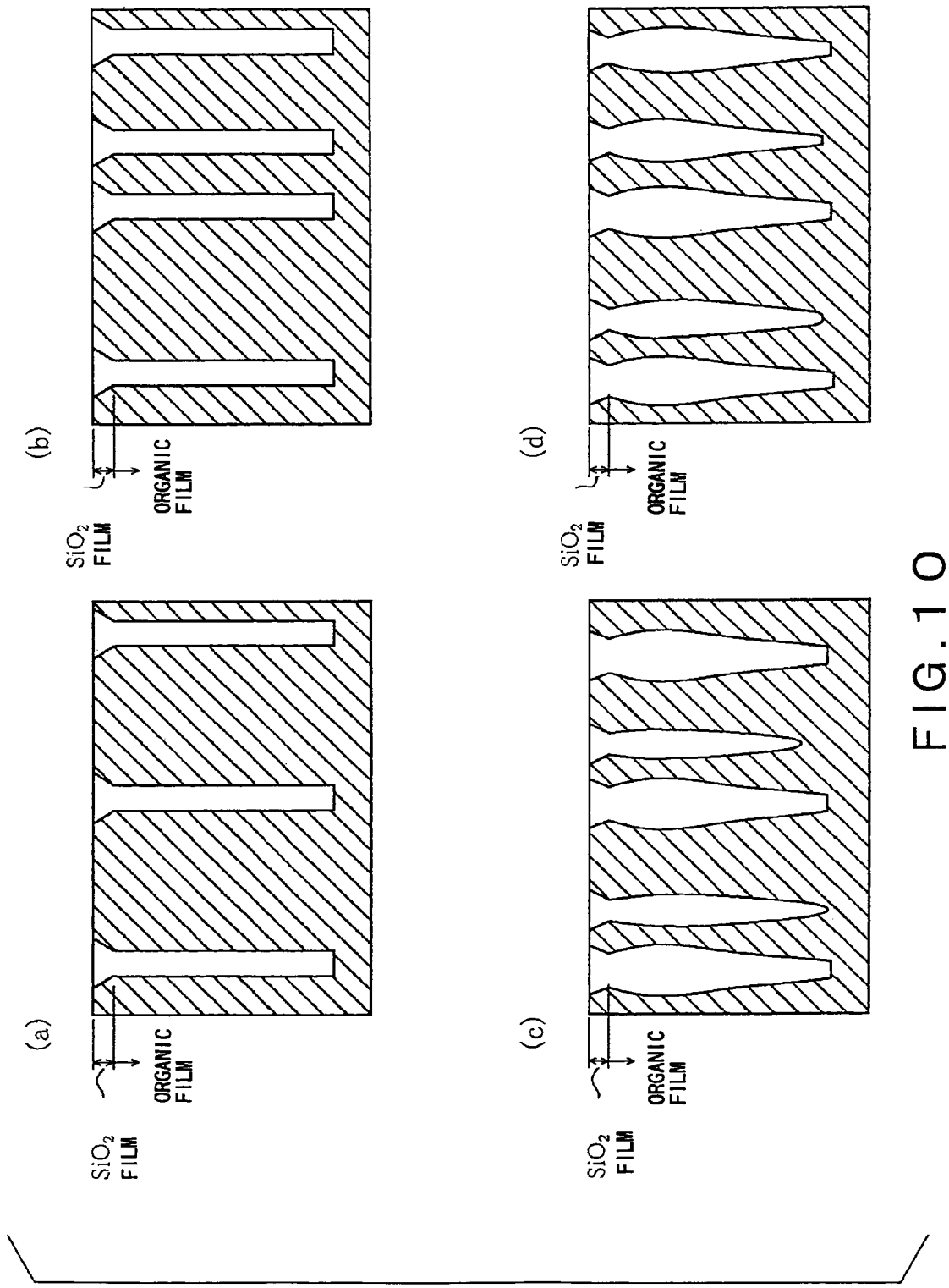
FIGS. 10(a) to 10(d) are schematic vertical cross-sectional views of a pattern obtained from evaluation tests.

In Evaluation Test 1-1, the wafer W having the film structure shown in FIG. 2(a) was subjected to etching according to the procedures of the first embodiment, and a vertical cross-section of the wafer W was then observed. The etching time for Steps S1, S2, S3, and S4 was set to 50 seconds, 30 seconds, 40 seconds, and 255 seconds, respectively. FIG. 10(a) is a schematic view of a pattern shape observed at the central part of the wafer W. FIG. 10(b) is a schematic view of a pattern shape observed at the circumferential edge of the wafer W. As shown in FIGS. 10(a) and 10(b), the side walls of the patterns formed on the organic film at the central part and the circumferential edge of the wafer W had a high degree of verticality.

(Evaluation Test 1-2)

In Evaluation Test 1-2, the wafer W having the same film structure as that of Evaluation Test 1-1 was subjected to etching according to Step S1, and Step S2 was then performed. However, the etching time of Step S2 was set longer than that of Evaluation Test 1-1, and Steps S3 and S4 were not performed. FIG. 10(c) is a schematic view of a pattern shape observed at the central part of the wafer W. FIG. 10(d) is a schematic view of a pattern shape observed at the circumferential edge of the wafer W. As shown in FIGS. 10(c) and 10(d), the side walls of each pattern were bow-shaped. The results of Evaluation Tests 1-1 and 1-2 demonstrated the effects of the present invention that implementing the processes of the invention increases the degree of verticality of a pattern formed in the organic film and prevents the pattern from becoming bow-shaped.

(Evaluation Test 2)

In Evaluation Test 2, the same film structure as that of FIG. 7(c) was formed on a wafer. However, the thickness of the organic film (H3 in FIG. 11(a)) is 800 nm, the total thickness of the SiO$_2$ film and the SiN film (H4 in FIG. 11(a)) is 90 nm. The thus-structured wafer was subjected to etching according to the procedures in Steps T1 to T6 of the second embodiment. The etching time for Steps T1, T2, T3, T4, T5, and T6 was set to 33 seconds, 20 seconds, 40 seconds, 100 seconds, 40 seconds, and 120 seconds, respectively.

Figure 11:
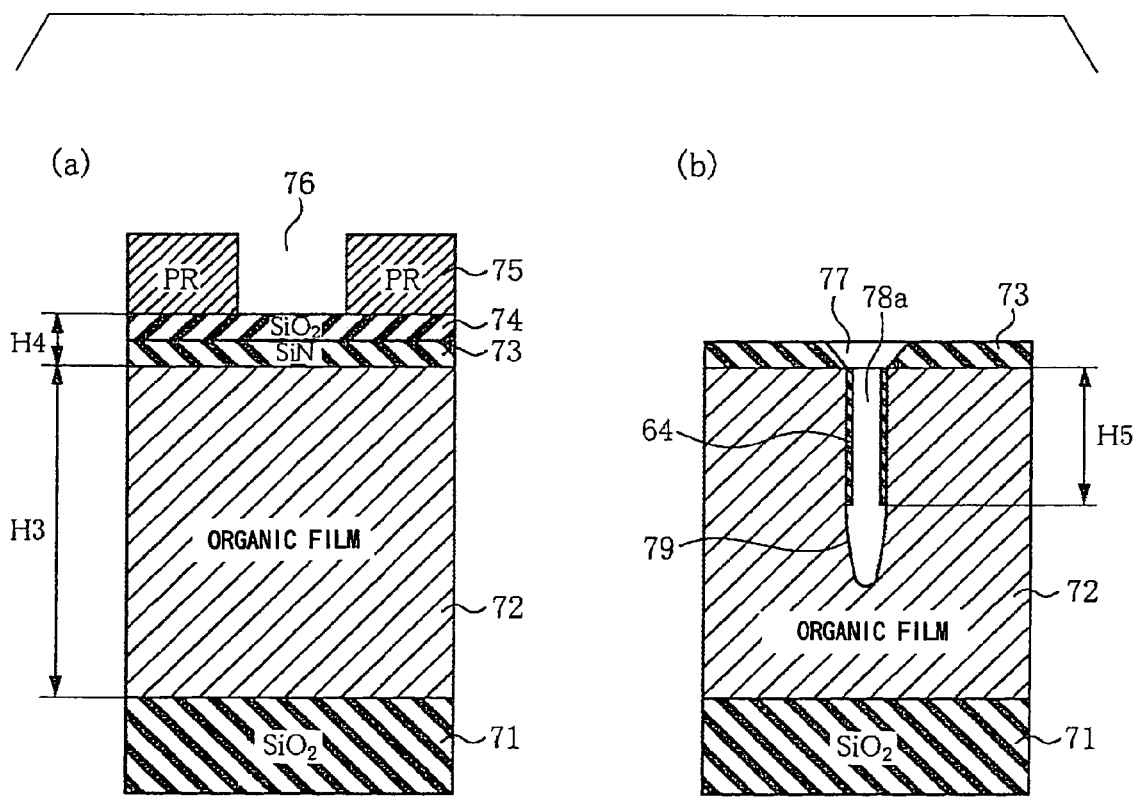
FIGS. 11(a) and 11(b) are schematic vertical cross-sectional views of a pattern obtained from another evaluation test.
Figure 12:
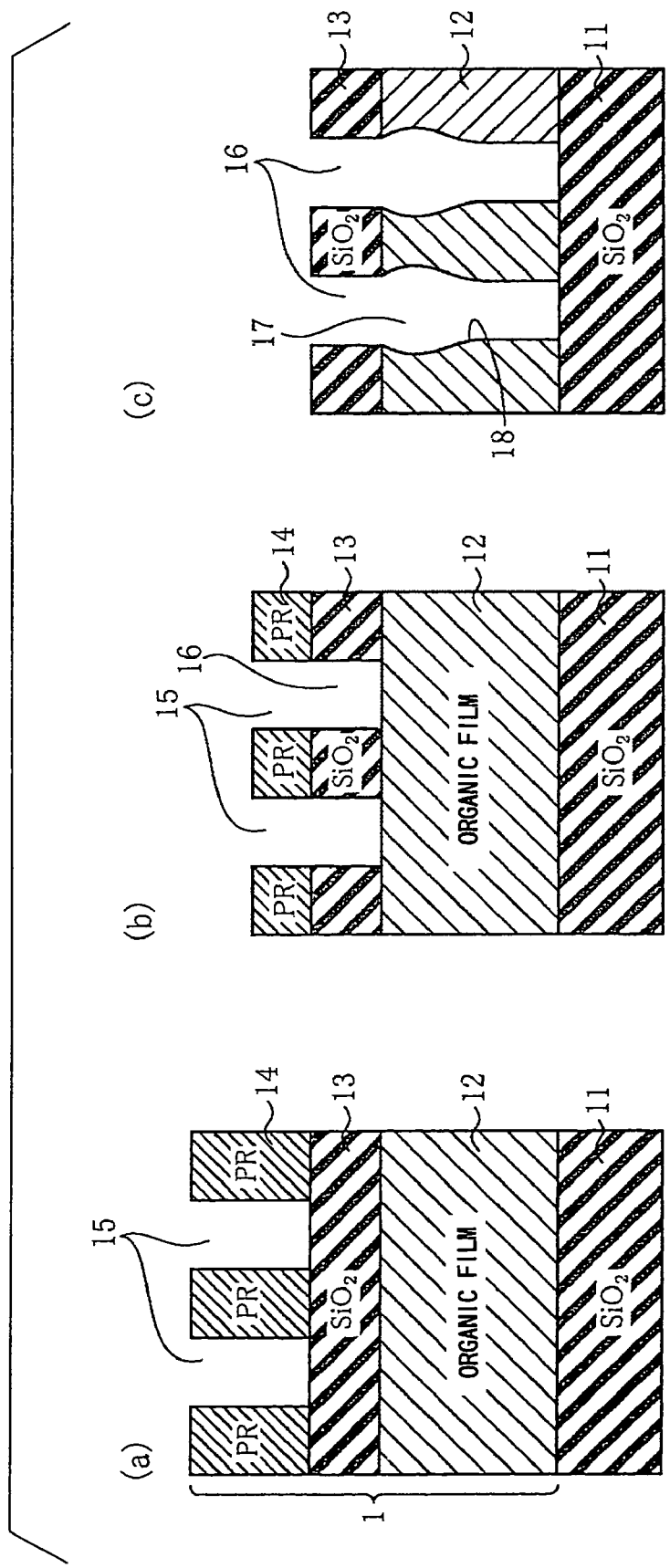
FIGS. 12(a) to 12(c) are fragmentary cross-sectional views showing pattern shapes formed on an organic film by a conventional etching method.

FIG. 11(b) is a schematic view of a vertical cross-section of the wafer W after etching was completed. Evaluation Test 2 revealed that the protection films 64 were formed in the concave portion 78a of the organic film 72, and the bow shape was not generated. The protection films 64 were formed from the top surface of the organic film 72 (the boundary between the organic film 72 and the SiN film 73) toward the lower portion of the concave portion 78a. The length from the upper edge to the bottom edge of the protection film 64, shown by reference symbol H5 in the figure, was 450 nm. The SiO$_2$ film 73 was etched almost up to a limit beyond which it did not serve as a mask for etching the organic film 72. The above experimental results demonstrated that, in order to form a protection film having a depth of 800 nm, which is the same value as the thickness of the organic film, it is necessary to form the SiO$_2$ film 74 and the SiN film 73 having a total thickness of 160 nm (obtained by (800 nm/450 nm)×90 nm). This thickness is ⅕ times the thickness of the organic film 72. Therefore, it can be inferred that forming silicon-containing films having a total thickness more than ⅕ times the thickness of the organic film allows protection of the entire side walls of a pattern.

What is claimed is:

1. A semiconductor device manufacturing method for etching with plasma a substrate having an organic film, a silicon-containing film on the organic film, and a pattern mask on the silicon-containing film to form a hole or groove in the organic film, the method comprising the steps of:
   preparing a substrate having an organic film, a silicon-containing film on the organic film, and a pattern mask on the silicon-containing film;
   etching with plasma the silicon-containing film of the substrate and transferring a pattern of the pattern mask onto the silicon-containing film to form a patterned silicon-containing film;
   removing the pattern mask using plasma to expose the surface of the silicon-containing film;
   etching the surface of the organic film through the patterned silicon-containing film by use of an oxygen active species in plasma to form on the organic film a concave portion having a depth that is smaller than the thickness of the organic film;
   sputtering the silicon-containing film to form silicon-containing protection films on the inner wall surfaces of the concave portion; and
   further etching the concave portion of the organic film, on which the protection films are formed, in the depth direction of the concave portion through the patterned silicon-containing film by use of an oxygen active species in plasma to form a hole or groove.

2. The semiconductor device manufacturing method according to claim 1, wherein
   the pattern mask is composed of a photoresist film.

3. The semiconductor device manufacturing method according to claim 1, wherein
   the step of transferring a pattern of the pattern mask onto the silicon-containing film includes the steps of: over-etching the silicon-containing film and etching the surface of the organic film to form the concave portion; and etching and removing only a part of the pattern mask.

4. The semiconductor device manufacturing method according to claim 1, wherein
   the step of removing the pattern mask uses plasma produced from a gas including a gas for sputtering a silicon-containing film.

5. The semiconductor device manufacturing method according to claim 1, wherein
   the step of etching the concave portion in its depth direction to form a hole or groove on the organic film uses plasma produced from a gas including a gas for sputtering a silicon-containing film.

6. The semiconductor device manufacturing method according to claim 4, wherein
   the gas for sputtering a silicon-containing film includes a gas composed of Ar, Xe, or He.

7. A semiconductor device manufacturing method for etching with plasma a substrate having an organic film, a silicon-containing film on the organic film, and a pattern mask on the silicon-containing film to form a hole or groove in the organic film, the method comprising the steps of:

preparing a substrate having an organic film;

forming on the organic film provided on the substrate a silicon-containing film having a thickness that is at least one fifth of the thickness of the organic film;

forming on the silicon-containing film a pattern mask for etching the silicon-containing film;

etching with plasma the silicon-containing film of the substrate and transferring a pattern of the pattern mask onto the silicon-containing film to form a patterned silicon-containing film;

removing the pattern mask using plasma to expose the surface of the silicon-containing film;

etching the surface of the organic film through the patterned silicon-containing film by use of an oxygen active species in plasma to form on the organic film a concave portion having a depth that is smaller than the thickness of the organic film;

sputtering the silicon-containing film to form silicon-containing protection films on the inner wall surfaces of the concave portion; and further etching the concave portion of the organic film, on which the protection films are formed, in the depth direction of the concave portion through the patterned silicon-containing film by use of an oxygen active species in plasma to form a hole or groove.

8. The semiconductor device manufacturing method according to claim 7, wherein
the pattern mask is composed of a photoresist film.

9. The semiconductor device manufacturing method according to claim 7, wherein
after forming the concave portion on the organic film, the method further comprising the steps of: forming the protection films on the concave portion; and etching the concave portion formed on the organic film in the depth direction of the concave portion; the steps being repeated in this order to form a hole or groove.

10. The semiconductor device manufacturing method according to claim 5, wherein
the gas for sputtering a silicon-containing film includes a gas composed of Ar, Xe, or He.

11. The semiconductor device manufacturing method according to claim 8, wherein
after forming the concave portion on the organic film, the method further comprising the steps of: forming the protection films on the concave portion; and etching the concave portion formed on the organic film in the depth direction of the concave portion; the steps being repeated in this order to form a hole or groove.

* * * * *